(12) United States Patent
Ertel (10) Patent No.: US 9,389,374 B2
(45) Date of Patent: Jul. 12, 2016

(54) FIBER OPTIC SUB-ASSEMBLY WITH LOW PROFILE

(71) Applicant: Corning Cable Systems LLC, Hickory, NC (US)

(72) Inventor: John Phillip Ertel, Half Moon Bay, CA (US)

(73) Assignee: CORNING CABLE SYSTEMS LLC, Hickory, NC (US)

( * ) Notice: Subject to any disclaimer, the term of this patent is extended or adjusted under 35 U.S.C. 154(b) by 280 days.

(21) Appl. No.: 13/906,701

(22) Filed: May 31, 2013

(65) Prior Publication Data

US 2014/0294352 A1    Oct. 2, 2014

Related U.S. Application Data

(60) Provisional application No. 61/806,157, filed on Mar. 28, 2013.

(51) Int. Cl.
| | | |
|---|---|---|
| G02B 6/42 | (2006.01) | |
| G02B 6/32 | (2006.01) | |
| H05K 1/02 | (2006.01) | |
| H05K 1/18 | (2006.01) | |

(52) U.S. Cl.
CPC ............. *G02B 6/4214* (2013.01); *G02B 6/32* (2013.01); *G02B 6/428* (2013.01); *G02B 6/4249* (2013.01); *G02B 6/4257* (2013.01); *H05K 1/0274* (2013.01); *H05K 1/182* (2013.01); *H05K 2201/09063* (2013.01); *H05K 2201/10121* (2013.01); *H05K 2203/167* (2013.01); *Y10T 29/49124* (2015.01)

(58) Field of Classification Search
CPC .................................................. G02B 6/4214
See application file for complete search history.

(56) References Cited

U.S. PATENT DOCUMENTS

| | | | | |
|---|---|---|---|---|
| 4,897,711 A | * | 1/1990 | Blonder et al. ................. 257/48 |
| 5,898,803 A | * | 4/1999 | Mueller-Fiedler et al. ..... 385/36 |
| 6,409,397 B1 | * | 6/2002 | Weigert ......................... 385/92 |
| 6,722,793 B2 | * | 4/2004 | Althaus et al. ................. 385/92 |
| 6,731,882 B1 | * | 5/2004 | Althaus et al. ............... 398/139 |
| 6,939,058 B2 | * | 9/2005 | Gurevich et al. .............. 385/93 |
| 7,063,467 B2 | | 6/2006 | Nagasaka et al. .............. 385/88 |
| 7,066,657 B2 | * | 6/2006 | Murali et al. .................. 385/92 |

(Continued)

FOREIGN PATENT DOCUMENTS

| | | | | |
|---|---|---|---|---|
| JP | 2006284781 A | * | 10/2006 | |
| WO | WO2012/076986 A1 | | 6/2012 | ............... H05K 1/02 |

OTHER PUBLICATIONS

Patent Cooperation Treaty International Search Report, Application No. PCT/US2014/030943, Jul. 22, 2014, 3 pages.

(Continued)

*Primary Examiner* — Michelle R Connelly (57) ABSTRACT

A fiber optic sub-assembly includes a printed circuit and a TIR sub-assembly supported by the printed circuit board. The printed circuit board includes opposed first and second surfaces and has a printed circuit board height defined by the distance between the first and second surfaces. The TIR sub-assembly has a nominal height between lowermost and uppermost portions thereof. The TIR sub-assembly is at least partially integrated into the printed circuit board so that an overall stack height of the printed circuit board and TIR sub-assembly is less than the sum of the printed circuit board height and nominal height of the TIR sub-assembly.

17 Claims, 6 Drawing Sheets

(56) References Cited

U.S. PATENT DOCUMENTS

| | | | |
|---|---|---|---|
| 7,116,886 B2* | 10/2006 | Colgan et al. | 385/137 |
| 7,539,367 B2* | 5/2009 | Tamura et al. | 385/14 |
| 7,543,994 B2 | 6/2009 | McColloch | 385/89 |
| 7,547,151 B2* | 6/2009 | Nagasaka | G02B 6/4214 385/53 |
| 8,774,576 B2* | 7/2014 | Shiraishi | 385/33 |
| 8,827,572 B2* | 9/2014 | Zhou | 385/88 |
| 8,888,383 B2* | 11/2014 | McColloch | 385/93 |
| 8,989,539 B2* | 3/2015 | Selli et al. | 385/39 |
| 2005/0141823 A1* | 6/2005 | Han et al. | 385/89 |
| 2005/0249449 A1 | 11/2005 | Welch et al. | 385/14 |
| 2007/0188457 A1 | 8/2007 | Wu et al. | 345/166 |
| 2008/0044141 A1* | 2/2008 | Willis et al. | 385/88 |
| 2010/0284647 A1* | 11/2010 | Stevenson | 385/14 |
| 2011/0123150 A1* | 5/2011 | Zbinden | G02B 6/4214 385/33 |
| 2014/0119689 A1* | 5/2014 | Yabre | G02B 6/4206 385/14 |
| 2014/0199019 A1* | 7/2014 | Yabre | G02B 6/4206 385/14 |
| 2014/0348462 A1* | 11/2014 | Yabre | G02B 6/42 385/14 |

OTHER PUBLICATIONS

Written Opinion issued in related case PCT/US2014/~030943, dated Jul. 22, 2014.

Communication pursuant to Rules 161(1) and 162 EPC, mailed on Nov. 19, 2015 in European Patent Application No. 14718879.1-1504.

* cited by examiner

FIBER OPTIC SUB-ASSEMBLY WITH LOW PROFILE

CROSS-REFERENCE TO RELATED APPLICATIONS

This application claims the benefit of priority under 35 U.S.C. §119 of U.S. Provisional Application Ser. No. 61/806,157 filed on Mar. 28, 2013, the content of which is relied upon and incorporated herein by reference in its entirety.

BACKGROUND

The disclosure relates generally to electric-optical systems, and more particularly to fiber optic sub-assemblies for active optical cable assemblies or the like.

Short-distance data links used for consumer electronics are reaching increasingly higher data rates, especially those used for video and data storage applications. Examples include the USB 3.0 protocol at 5 Gb/s, HDMI at 10 Gb/s and Thunderbolt™ at 10 Gb/s over two channels. At such high data rates, traditional copper cables have limited transmission distance and cable flexibility. For at least these reasons, optical fiber is emerging as an alternative to copper wire for accommodating the high data rates for the next generations of electronic devices such as consumer devices.

Unlike telecommunication applications that employ expensive, high-power edge-emitting lasers along with modulators, short-distance optical fiber links are based on low-cost, low-power, directly-modulated light sources such as vertical-cavity surface-emitting lasers (VCSELs). In general, optical fiber links include fiber optic assembles that are used to couple light from the light source into an optical fiber in one direction (i.e., transmit). The fiber optic assemblies are also used to couple light traveling in another optical fiber onto a photodiode in the other direction (i.e., receive). To be viable for consumer electronics and the like, the fiber optic assemblies need to be low-cost. This requirement drives the need for designs that are simple to manufacture yet have suitable performance.

SUMMARY

Embodiments of a fiber optic sub-assembly are disclosed herein. The fiber optic sub-assembly may be part of an active optical cable assembly, and specifically connectors of such active optical cable assemblies, examples of which are also disclosed.

According to one embodiment, a fiber optic sub-assembly includes a printed circuit and a TIR sub-assembly supported by the printed circuit board. The printed circuit board includes opposed first and second surfaces and has a printed circuit board height defined by the distance between the first and second surfaces. The TIR sub-assembly has a nominal height between lowermost and uppermost portions thereof. The TIR sub-assembly is at least partially integrated into the printed circuit board so that an overall stack height of the printed circuit board and TIR sub-assembly is less than the sum of the printed circuit board height and nominal height of the TIR sub-assembly.

According to another embodiment, one of the first and second surfaces of the printed circuit board is an upper surface of the printed circuit board and the other of the first and second surfaces is a lower surface of the printed circuit board. The TIR sub-assembly defines an optical path and includes an active device electrically coupled to the printed circuit board, a lens spaced apart from the active device, and an optical turning member configured to change the direction of the optical path. The active device is configured to emit light normal to the first or second surface of the printed circuit board or to collect light directed toward the active device. The lens is configured to collect the light emitted by or concentrate the light directed to the active device. Thus, the lens is positioned in the optical path. At least a portion of the optical path between the active device and lens is located between the first and second surfaces of the printed circuit board.

Finally, a method of manufacturing a fiber optic sub-assembly is also disclosed. The method involves providing a printed circuit board with opposed first and second surfaces, such as that described above, where one of the first and second surfaces is an upper surface of the printed circuit board and the other of the first and second surfaces is a lower surface of the printed circuit board. The printed circuit board has at least one passive device positioned on the second surface. The method also involves supporting an active device on the printed circuit board in a position that is offset from the first surface in a direction towards the second surface. The active device is configured to emit light normal to the first or second surface of the printed circuit board or collect light directed to the active device. Further, the method involves electrically coupling the active device to the passive device and positioning a body of a total internal reflection sub-assembly on the printed circuit board. The body defines at least a portion of an optical path and supports an optical turning member and a lens. The optical turning member is configured to change the direction of the optical path, and the lens is configured to collect the light emitted by the active device or concentrate light directed to the active device.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention. In the drawings.

DETAILED DESCRIPTION

Reference will now be made in detail to fiber optic sub-assemblies for active optical cable assemblies, with examples of the latter being illustrated in the accompanying drawings. Wherever possible, the same reference numbers will be used throughout the drawings and description to refer to the same or like parts.

Some of the drawings show the fiber optic sub-assemblies within a connector of an active optical cable assembly. The active optical cable assemblies may be used in the consumer electronics field. For example, the connectors may be USB, Thunderbolt, HDMI, or PCI Express connectors. However, the disclosure is not limited to such connectors or consumer electronics applications. Other optical cable assemblies and applications are possible for the fiber optic sub-assemblies described herein.

Figure 1:
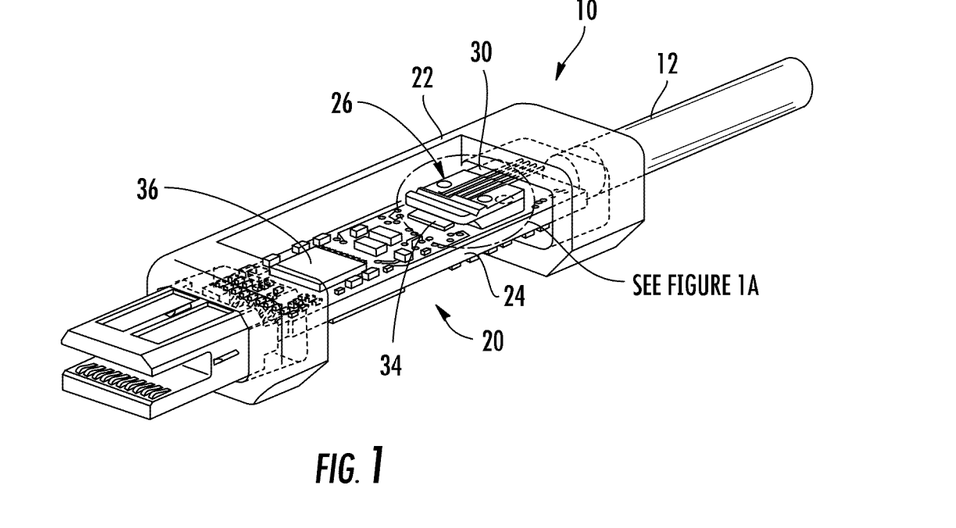
FIG. 1 is a perspective view, partially cut-away, of a connector for an active optical cable, wherein the connector includes a fiber optic sub-assembly having a known configuration.
Figure 1A:
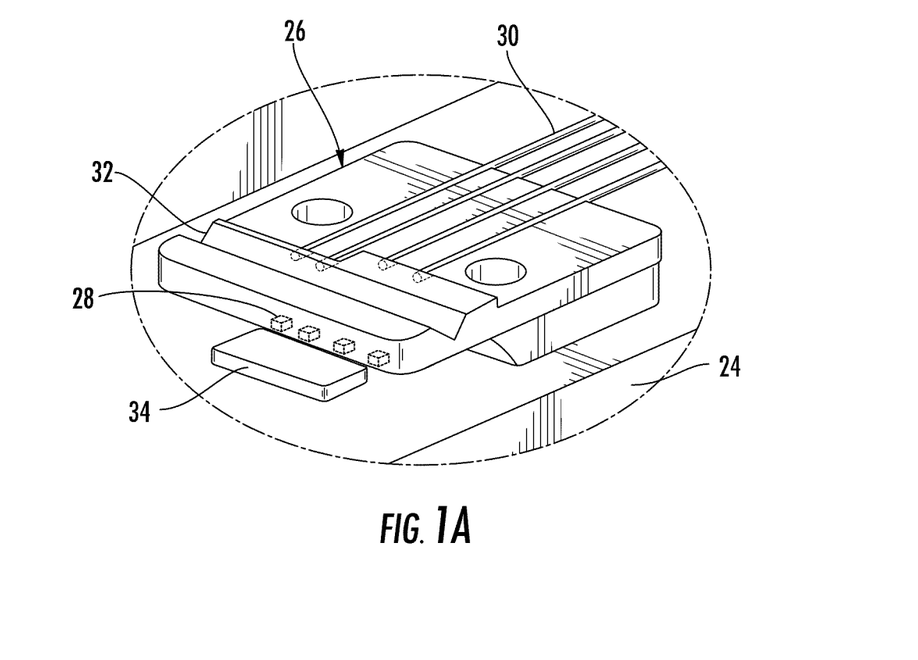
FIG. 1A is an enlarged view of the area circled in FIG. 1.

With this mind, FIGS. 1 and 1A illustrate a known arrangement for a fiber optic sub-assembly 20 within a connector 22 of an active optical cable assembly 10. The fiber optic sub-assembly 20 includes a printed circuit board 24 and total internal reflection (TIR) sub-assembly 26 supported on the printed circuit board 24. The TIR sub-assembly 26 includes one or more active devices 28 (four are shown in the illustrated embodiment) electrically coupled to the printed circuit board 24 and optically coupled to a respective optical fiber 30. To this end, the TIR sub-assembly 20 defines optical paths between the active devices 28 and optical fibers 30, which extend into the connector 20 from a cable 12 that bundles and protects the optical fibers 30.

The active devices 28 may be light sources, such as vertical-cavity surface-emitting lasers (VCELs), or light detectors, such as photodiodes. Light traveling from the active devices 28 to the optical fibers 30 is collected by lenses (not shown in FIGS. 1 and 1A) in each of the optical paths and directed to an optical turning member 32 (typically an angled mirror), which then reflects the light approximately 90 degrees toward ends of the optical fibers 30. Conversely, light traveling from the optical fibers 30 to the active devices 28 is reflected by the optical turning member 32 towards the lenses, which concentrate and direct the light at the active devices 28. Thus, there is a change in direction in the optical paths between the optical fibers 30 and active devices 28. The distance of the optical fibers 30 from the optical turning member 32, which may either be a common or respective optical turning member 32, depends on the design of the optical system (e.g., the type of active device 28, size of lens in the optical path, etc.).

The lenses in a TIR sub-assembly like the one shown in FIG. 1 are spaced a specific distance from the active devices 28, with an air gap maintained therebetween, based on the properties of the active devices 28 (e.g., the optical power) and other considerations familiar to persons skilled in the design of optical systems. The need for this spacing and the presence of the optical turning member 32 (e.g., one or more angled mirrors) for changing the direction of the optical paths influences the overall height of the TIR sub-assembly 26. This height may even be greater than other components on the printed circuit board 24 and thereby influence the overall profile, or "stack height," of the fiber optic sub-assembly 20. Furthermore, the need to support the lenses over the active devices 28 may restrict or limit the placement of passive devices 34 close to the active devices 28. Such passive devices 34 may include transimpedance amplifiers, resistors, capacitors, inductors, and other circuit components electrically coupled to one or more chips 36 on the printed circuit board 42. Increasing the distance between the active devices 28 and passive devices 34 may increase losses beyond acceptable limits at high transmission rates.

For example, passive components such as a capacitor are sometimes needed to reduce noise in the signal from an active component like a photodiode. The capacitor provides a low impedance at high frequencies so that power supply noise does not couple through the photodiode's internal capacitance and reach other passive components connected to the photodiode, such as a transimpedance amplifier. But the wires or traces that connect the capacitor to the photodiode tend to negate the low impedance by acting as a series inductor, which has an impedance that rises linearly with frequency. The longer the wires or traces, the more they negate the desired low impendance (and resulting short circuit) provided by the capacitor at high frequencies. Additionally, sufficient inductance may introduce an unwanted resonant frequency in the circuit.

Figure 2:
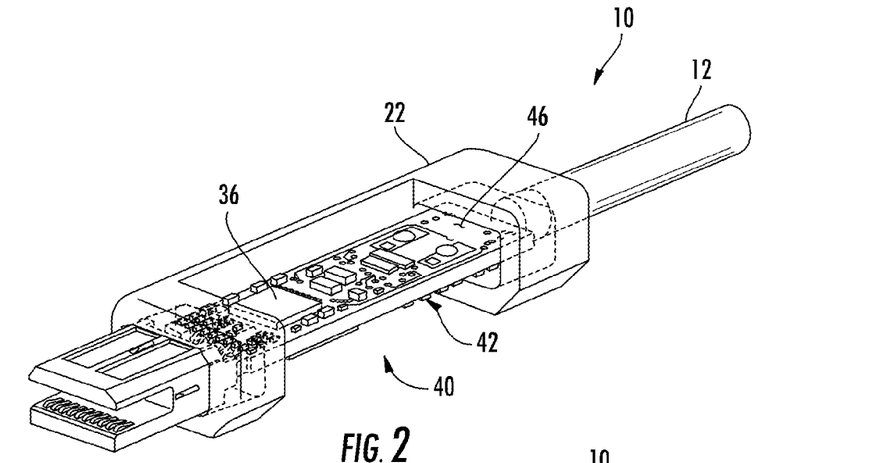
FIG. 2 is a perspective view, partially cut-away, of a connector including a fiber optic sub-assembly according to one embodiment.
Figure 3:
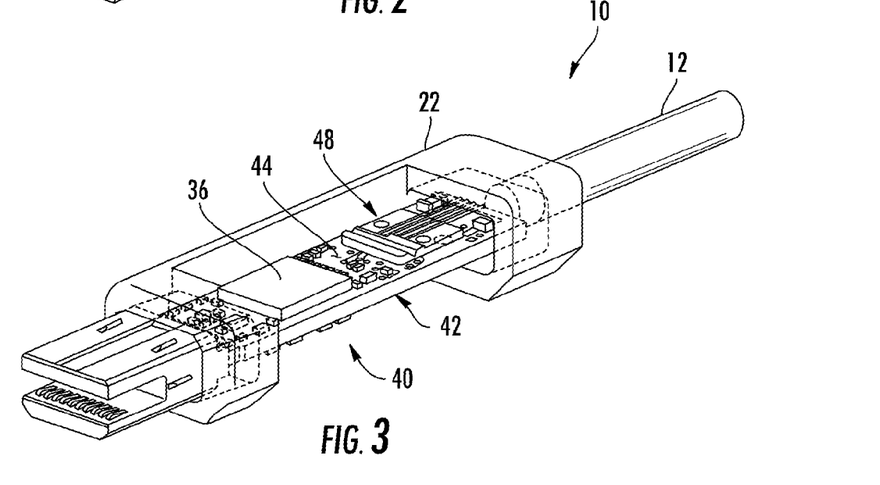
FIG. 3 is a perspective view, partially cut-away and similar to FIG. 2, but showing an opposite side of the connector and fiber optic sub-assembly.
Figure 4:
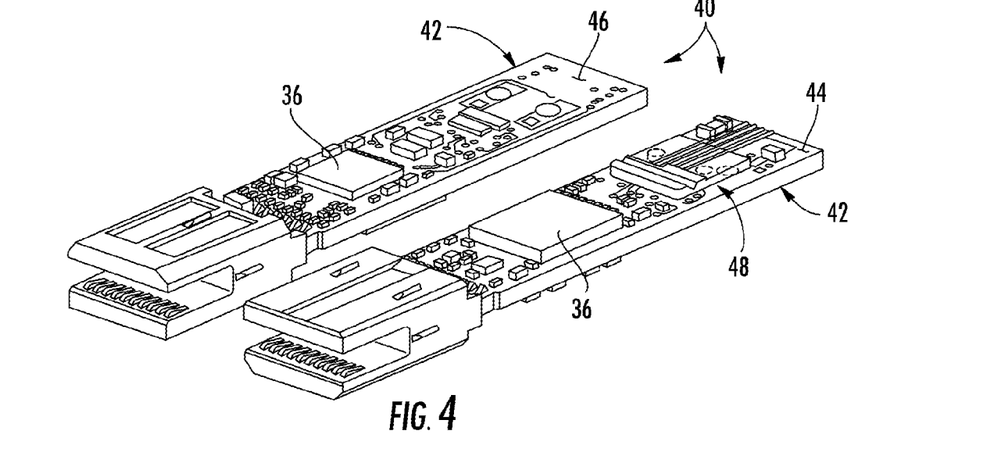
FIG. 4 is a perspective view showing the fiber optic sub-assembly of FIGS. 2 and 3 in isolation.

FIGS. 2 and 3 illustrate an exemplary embodiment of new arrangement for a fiber optic sub-assembly 40 intended to address some of the above-mentioned challenges. Like FIG. 1, FIGS. 2 and 3 illustrate the fiber optic sub-assembly 40 within the connector 22 of an active optical cable assembly 10. Different views are provided to show opposite sides of a printed circuit board 42 in the fiber optic sub-assembly 40. FIG. 4 illustrates the fiber optic sub-assembly 40 in isolation for both views. In general, the printed circuit board 42 has opposed first and second surfaces 44, 46. A total internal reflection (TIR) sub-assembly 48 is at least partially integrated into the printed circuit board 42 and supported thereby. The configuration is such that the overall stack height (i.e., profile) defined by the printed circuit board 42 and integrated TIR sub-assembly 48 is less than a non-integrated configuration involving the same components. In other words, the distance between the first and second surfaces 44, 46 defines a printed circuit board height. The distance between lowermost and uppermost portions of the TIR sub-assembly 48 defines a nominal height of the TIR sub-assembly 48. The overall stack height referred to above is less than the sum of the printed circuit board height the nominal height of the TIR sub-assembly.

Figure 5:
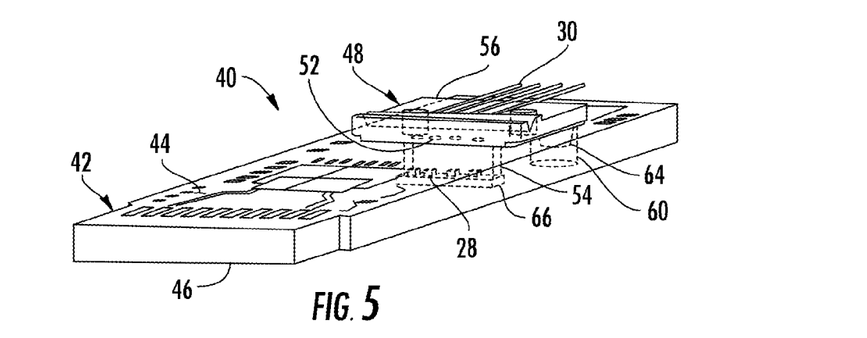
FIG. 5 is a perspective view of a portion of the fiber optic sub-assembly of FIGS. 2 and 3.
Figure 6:
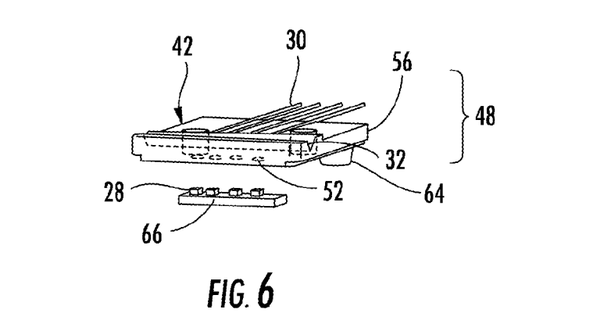
FIG. 6 is an exploded perspective view of a total internal reflection sub-assembly included in the fiber optic sub-assembly shown in FIG. 5.
Figure 7:
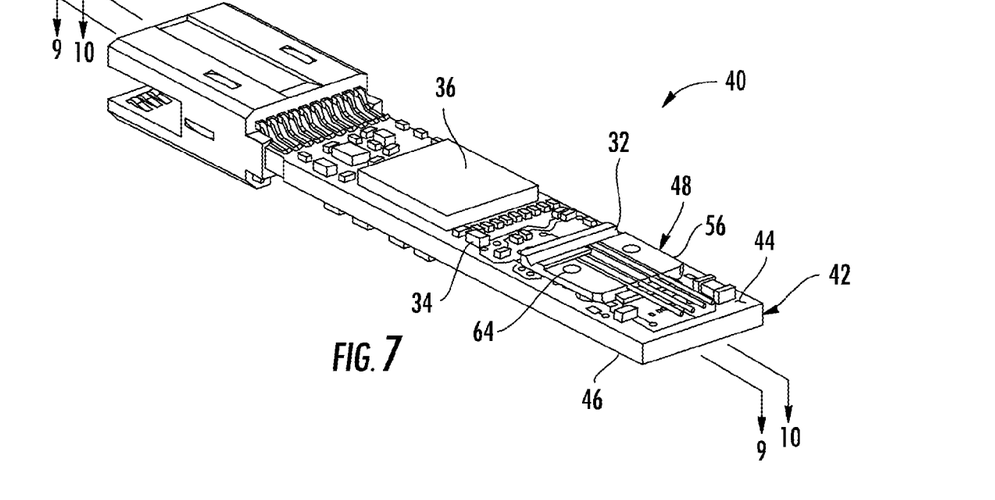
FIG. 7 is a perspective view of the fiber optic sub-assembly of FIGS. 2 and 3, wherein the fiber optic sub-assembly is illustrated in isolation and from a different angle.
Figure 8:
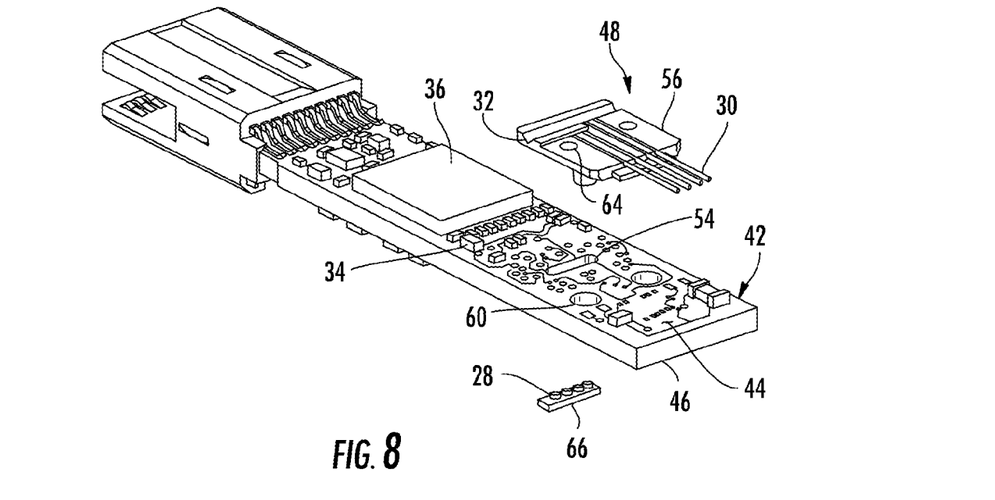
FIG. 8 is an exploded perspective view of the fiber optic sub-assembly shown in FIG. 7.
Figure 9:
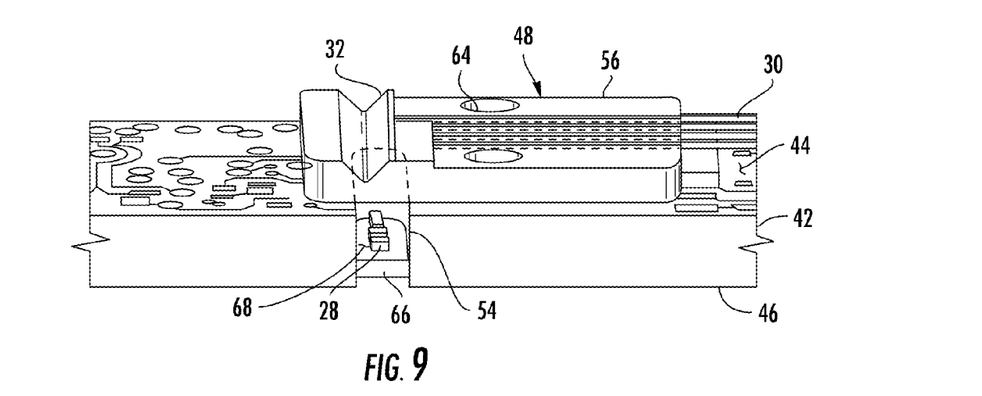
FIG. 9 is a cross-sectional perspective view taken along line 9-9 in FIG. 7.

Reference will now be made to FIGS. 5-10 to describe the fiber optic sub-assembly 40 in further detail. As mentioned above, the embodiment is merely an example; different embodiments of the new arrangement mentioned above will be appreciated by persons skilled in the art. As shown in FIGS. 5 and 6, the TIR sub-assembly 48 in this embodiment includes four active devices 28 and four lenses 52. Each active device 28 and lens 52 is associated with a corresponding optical path defined by the TIR sub-assembly 48. Four active devices 28 and four lenses 52 are provided in the embodiment shown (e.g., for four different optical paths), although more or fewer may be provided in alternative embodiments.

At least a portion of the optical path between each active device 28 and lens 52 is located between the first and second surfaces 44, 46 of the printed circuit board 42. For example, the printed circuit board 42 may include an opening or hole 54 to allow components of the TIR sub-assembly 48 to be supported on opposite sides of the printed circuit board 42. In the embodiment shown, the TIR sub-assembly 48 includes a body 56 coupled to the side of the printed circuit board 42 that includes the first surface 44. The body 56 supports the optical fibers 30, optical turning member 32, and lenses 52. The optical fibers 30 may be supported in V-grooves (not numbered in FIGS. 5-10) on an upper surface of the body 56, for example, and may extend in a plane substantially parallel to the first surface 44 of the printed circuit board 42. The lenses 52 are supported on an underside surface 58 (FIG. 10) that faces the first surface 44 of the printed circuit board 42. The body 56 is positioned on the printed circuit board 42 so that lenses 52 are aligned with the opening 54 in the printed circuit board 42. FIGS. 7-10 illustrate these aspects in further detail.

As shown in FIGS. 7-10, the body 56 may be designed to rest on the first surface 44 of the printed circuit board 42. The body 56 may also be shaped so that the underside surface 58 with the lenses 52 at least partially covers or overhangs the opening or hole 54. Fiducial features 60 (e.g., holes or other reference structures) are provided on the printed circuit board 42 to properly align and position the body 56 (and lenses 52 supported thereby) relative to the printed circuit board 42. As will be described in greater detail below, the body 56 may include alignment features 64 (e.g., fiducial holes, projections, or other structures) configured to cooperate with the fiducial features 60 for this purpose.

Figure 10:
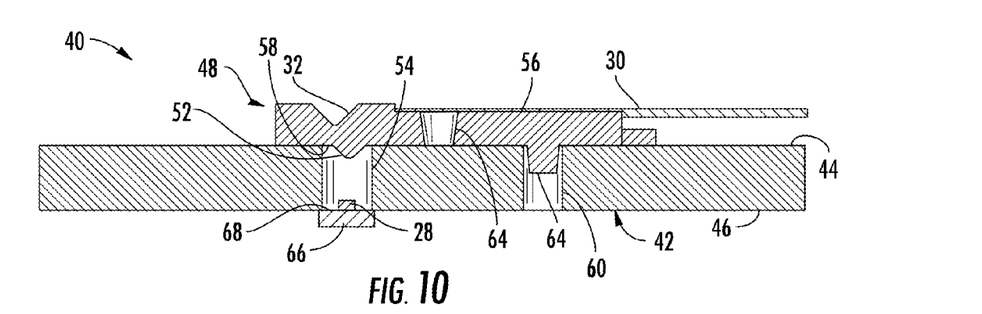
FIG. 10 is a cross-sectional elevation view taken along line 10-10 in FIG. 7.

FIG. 10 illustrates how at least a portion of each lens 52 extends into the opening 54 in the printed circuit board 42 so as to be offset from the first surface 44 in a direction towards the second surface 46. This is due to the body 56 resting on the first surface 44. In alternative embodiments, the printed circuit board 42 may include a recess or slot that receives the body 56 so that a lower surface of the body 56 is also offset from the first surface 44 of the printed circuit board 42 in a direction towards the second surface 46. The lenses 54 in such embodiments may therefore be positioned closer to the active devices 28, if necessary based on the design of the optical system. Arrangements will also be appreciated where the body 56 is shaped to support the lenses 54 above the first surface 44.

Referring back to FIGS. 5-10 in general, the TIR sub-assembly 48 in the embodiment shown further includes a carrier 66 coupled to the second surface 46 of the printed circuit board 42. The carrier 66 at least partially covers the opening 54 in the printed circuit board 42 and supports the active devices 28 on an upper surface 68 (FIGS. 9 and 10) that faces the lenses 52. The active devices 28 may be, for example, wire-bonded to pads on the carrier 66. Conductors or other electrical links or traces (not shown) on the carrier 66 and printed circuit board 42 may be used to electrically couple the active devices 28 to one or more passive devices 34. The active devices 28 may alternatively or additionally be bonded to the carrier 66 using conductive epoxy.

Alignment of the active devices 28 and lenses 52 may be achieved by using the contours of the carrier 66 as a reference for position registration of the active devices 28. The carrier 66 may then be coupled to the printed circuit board 42 with a vision system that uses the fiducial features 60 as a reference. Because the alignment features 64 on the body 56 cooperate with the fiducial features 60 to position the body 56 on the printed circuit, the lenses 52 on the body 56 are, in effect, located using the fiducial features 60 as references as well. Other alignment schemes are possible, however, including those using a "look up/look down" optical alignment system.

For example, the carrier 66 with the active devices 28 may first be coupled to the printed circuit board 42. A beam splitter (not shown) may then be positioned somewhere between the active devices 28 and the body 56, with the latter being moved in a horizontal plane (i.e., X and Y-directions in a reference coordinate system) until the active devices 28 are aligned with the lenses 52. At this point the beam splitter may be removed and the body 56 and/or printed circuit board 42 may be moved vertically (i.e., in a Z-direction) until the two contact each other. The geometries are such that upon contact, the proper distance is present between the active devices 28 and lenses 52 for the particular optical system design. The body 56 may be bonded in place to the printed circuit board 42 after this positioning using a quick-curing adhesive, such as a UV-curing adhesive, or fixed in position using other known techniques.

In alternative embodiments not shown herein, the opening 54 in the printed circuit board 42 may be a recess or well with a bottom surface. The active devices 28 may be positioned on the bottom surface of the recess or well such that a carrier is not needed. Persons skilled in the art will appreciate other variations of the types of arrangements described above, where the active devices 28 are offset from the first surface 44 of the printed circuit board 42 in a direction towards the second surface 46 and the printed circuit board 42 is shaped so that a space is maintained between the active devices 28 and lenses 52.

Figure 11:
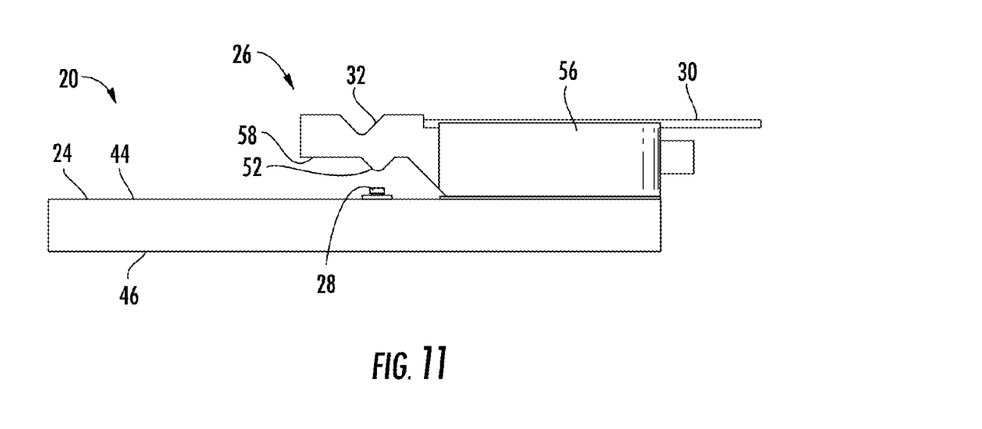
FIG. 11 is a side elevation view of a fiber optic sub-assembly having a known configuration.

As can be appreciated, the TIR sub-assembly 48 makes use of space in the printed circuit board 42 to provide the fiber optic sub-assembly 40 with a lower profile than known arrangements. This can best be appreciated by comparing FIG. 10, which illustrates a portion of the fiber optic sub-assembly 40, to FIG. 11, which illustrates a portion of the fiber optic sub-assembly 20. Positioning the active devices 28 proximate or otherwise closer to the second surface 46 of the printed circuit board 42 enables the lenses 54 to be supported proximate or below the first surface 44 (like in FIG. 10) rather than above the first surface 46 (like in FIG. 11). The overall stack height is reduced considerably while maintaining the required space between the active devices 28 and lenses 52, thereby helping the fiber optic sub-assembly 40 meet the difficult space requirements for standard connector packages in the consumer electronics field or the like.

Moreover, positioning the component of the TIR sub-assembly 48 that supports the optical fibers 30 and lenses 52 (i.e, the body 56) on an opposite side of the printed circuit board 42 than the active devices 28 allows the passive devices 34 (FIGS. 7 and 8) to be positioned much closer to the active devices 28. Short electrical path lengths are possible, which results in improved signal to noise performance. The increased freedom to position the passive devices 34 is particularly advantageous for TIR sub-assemblies including more two or more optical fibers (and, therefore, two or more optical paths/channels) because the number of passive devices required increases with the number of optical fibers. Positioning the increased number of passives devices close enough to the active devices so that signal to noise losses remain within acceptable levels can be a challenge, especially when there are four or more optical paths/channels. By not having the body 56 limit the positioning of the passive devices 34 and by providing a low profile/stack height, this challenge can be met in a manner so that a large number of optical paths/channels (e.g., four or more) may be provided with the fiber optic sub-assembly still fitting within standard connector packages.

Figure 12:
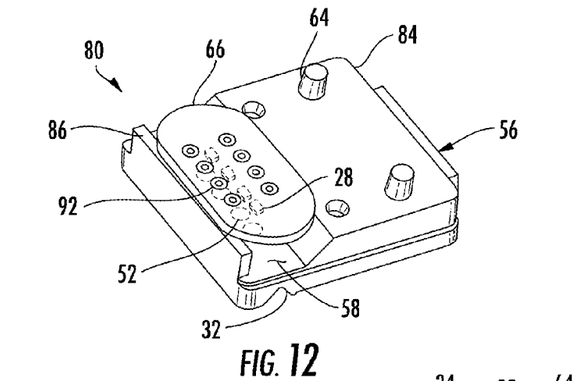
FIG. 12 is a perspective view of a total internal reflection sub-assembly according to another embodiment.
Figure 13:
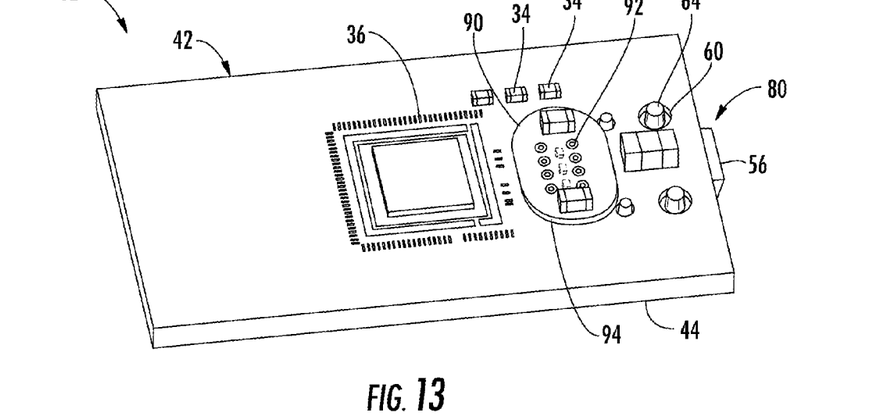
FIG. 13 is a perspective view of an embodiment of a fiber optic sub-assembly including the total internal reflection assembly of FIG. 12.
Figure 14:
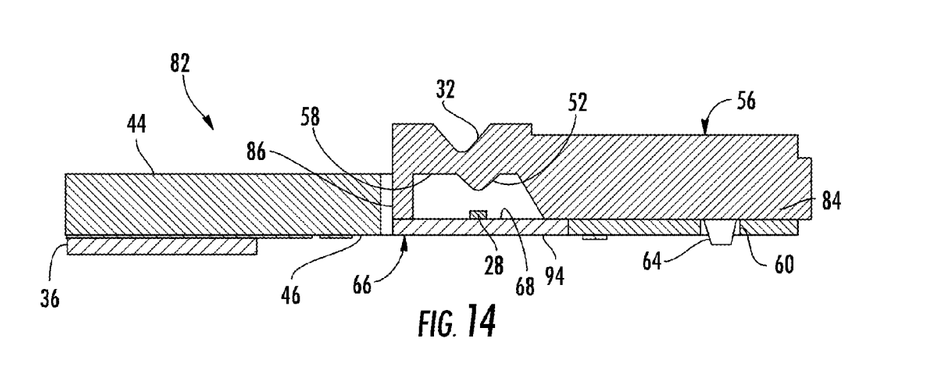
FIG. 14 is a cross-sectional side view of a portion of the fiber optic sub-assembly shown in FIG. 13.

FIG. 12 illustrates a TIR sub-assembly 80 according to an alternative embodiment, and FIGS. 13 and 14 illustrate the TIR sub-assembly 80 as part of a fiber optic sub-assembly 82. The TIR sub-assembly 80 may be at least partially integrated with a printed circuit board 42 of the fiber optic sub-assembly 82 such that the advantages mentioned above apply equally to this embodiment. The manner in which the integration is achieved is different, however, due to the TIR sub-assembly 80 having a different configuration.

In particular, the carrier 66 supporting the active devices 28 is coupled to the body 56 of the TIR sub-assembly 80 rather than to the printed circuit board 42. The body 56 is shaped to support the carrier 66 on opposite sides of the active devices 28 and to maintain a space between the active devices 28 and lenses 52. In the embodiment shown, the body 56 includes first and second portions 84, 86 extending from the underside surface 58 on opposite sides of the lenses 52. The first portion 84 is prismatic or block-like and provides support for the portion of the body 56 on which the optical fibers 30 are disposed. The second portion 86 is also prismatic or block-like, but has a smaller width or thickness than the first portion 84. To this end, the first portion 84 may be considered a main support for the body 56 while the second portion 86 may be considered a support rim that is spaced from the main support. The space maintained between the upper surface 68 of the carrier 66 on which the active devices 28 are disposed and the underside surface 58 of the body 56 on which the lenses 52 are disposed forms a passage between the first and second portions 84, 86. In alternative embodiments, the first and second portions 84, 86 may be joined so that the space takes the form of hole or well in the body 56 (e.g., with the underside surface 58 being a bottom surface of the hole or well). Other shapes and configurations of the body 56 that allow the upper surface 68 of the carrier 66 to be coupled to the body 56 on opposite sides of the active devices 28 will be appreciated by persons skilled in the art.

The printed circuit board 42 is shaped to receive the TIR sub-assembly 80, as shown in FIGS. 13 and 14. To this end, a slot or recess (not numbered) may be formed in the first surface 44 of the printed circuit board 42 to accommodate the first and second portions 84, 86 of the body 56. Additionally, an opening 90 extends through the printed circuit board 42 to the second surface 46 thereof to accommodate the carrier 66.

The alignment features 64 on the body 56 cooperate with corresponding fiducial features 60 on the printed circuit board 42 to help enable proper positioning of the TIR sub-assembly 80 (and particularly the active devices 28) relative to the printed circuit board 42. The alignment features 64 may be in the form of fiducial holes or alignment pins, for example. Persons skilled in the art of electric-optical systems will appreciate more detailed aspects of positioning processes that use such alignment features and fiducial features. In terms of the TIR sub-assembly 80, however, note that the active devices 28 may be positioned relative to the lenses 52 prior to supporting the TIR sub-assembly 80 on the printed circuit board 42. This pre-alignment may be achieved, for example, by using the alignment features 64 (e.g., fiducial holes) as a positional reference when coupling the carrier 66 to the body 56. The alignment features 64 have an accurate location with respect to lenses 52 and are used to position the body 56 relative to the printed circuit board 42 (as discussed above). Positioning the active devices 28 relative to the lenses 52 in this manner may result in a smaller tolerance stack-up and thereby provide better alignment between the active devices 28 and lenses 52. Moreover, aligning the active devices 28 and lenses 52 only with reference to the TIR sub-assembly 80 directly may reduce or relax the accuracy required for positioning the body 56 relative to the printed circuit board 42.

As can be appreciated from FIG. 13, the fiber optic sub-assembly 82 still allows passive devices 34 to be positioned in close proximity to the active devices 28. Conductors 92 may be electrically coupled to the active devices 28 and extend through the carrier 66 to lower surface 94 of the carrier 66. Additional conductors or electrical leads/traces (not shown) then electrically couple the conductors to the passive devices 34 on the printed circuit board 42. If desired, some passive devices 34 may even be supported on a lower surface 94 of the carrier 66.

One of the benefits of the fiber optic sub-assembly 82 is that it is a self-contained sub-assembly including the active devices 28 and lenses 52. This not only allows the active devices 28 and lenses 52 to be pre-aligned (i.e., aligned before supporting the TIR sub-assembly 80 on the printed circuit board 42) as discussed above, but also allows the optical system to be tested independently of the printed circuit board 42. If for some reason the optical system does not function properly, only the TIR sub-assembly 80 is lost. The printed circuit board 42 and its electronic components are not affected by the failure/loss because they were never connected the TIR sub-assembly 80. In other words, losses the entire fiber optic sub-assembly 82 need not be replaced.

It will be apparent to those skilled in the art that various modifications and variations can be made without departing from the spirit or scope of the invention. For example, the TIR sub-assembly 80 is illustrated with the carrier 66 having a smaller footprint area than the body 56. No portion of the carrier 66 extends transversely beyond the body 56. In alternative embodiments, portions of the carrier 66 may extend in this manner such that the portions do not face/confront the body 56.

Since these and other modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A fiber optic sub-assembly, comprising:
   a printed circuit board comprising:
   a first surface and a second surface opposite the first surface;
   a recess formed in the first surface; and
   an opening extending from the first surface to the second surface within the recess; and
   a total internal reflection sub-assembly comprising:
   a total internal reflection body comprising:
   a lowermost portion comprising a passage;
   at least one lens within the passage of the lowermost portion;
   a first portion contacting the first surface of the printed circuit board within the recess; and
   a second portion,
   wherein the first portion and the second portion extend from the lowermost portion on opposite sides of the at least one lens; and
   a carrier comprising a first surface and a second surface opposite the first surface; and
   at least one active device coupled to the first surface of the carrier,
   wherein:
   the carrier is directly coupled to the lowermost portion of the total internal reflection body such that the first portion and the second portion of the total internal reflection body contact the first surface of the carrier on opposite sides of the at least one active device and maintain a space between the at least one active device and the at least one lens, the carrier covers at least a portion of the passage, and the at least one active device is aligned with the at least one lens such that an optical path is present between the at least one active device and the at least one lens, and the total internal reflection body is coupled to the printed circuit board at the recess such that the carrier is disposed within the opening of the printed circuit board.

2. The fiber optic sub-assembly of claim 1, wherein the total internal reflection body further comprises an uppermost portion opposite the lowermost portion, the uppermost portion comprising an optical turning member that is aligned with the at least one lens.

3. The fiber optic sub-assembly of claim 2, wherein the fiber optic sub-assembly further comprises at least one optical fiber supported on the uppermost portion of the total internal reflection body, wherein the optical path extends between the at least one optical fiber and the at least one active device.

4. The fiber optic sub-assembly of claim 1, further comprising at least one passive device coupled to the second surface of the carrier.

5. The fiber optic sub-assembly of claim 1, wherein:
the printed circuit board comprises one or more fiducial features; and
the total internal reflection body comprises one or more alignment features disposed within the one or more fiducial features to position the total internal reflection sub-assembly relative to the printed circuit board.

6. The fiber optic sub-assembly of claim 1, wherein the at least one lens comprises a plurality of lenses, and the at least one active device comprises a plurality of active devices.

7. The fiber optic sub-assembly of claim 1, wherein the at least one active device comprises at least one of a light source and a light detector.

8. The fiber optic sub-assembly of claim 7, wherein the light source comprises a vertical cavity surface-emitting laser and the light detector comprises a photo diode.

9. The fiber optic sub-assembly of claim 1, wherein only the carrier is disposed within the opening of the printed circuit board.

10. An active optical cable assembly comprising:
a cable with at least one optical fiber;
a connector coupled to an end of the cable; and
a fiber optic sub-assembly disposed within the connector, the fiber optic sub-assembly comprising:
a printed circuit board comprising:
a first surface and a second surface opposite the first surface;
a recess formed in the first surface; and
an opening extending from the first surface to the second surface within the recess; and
a total internal reflection sub-assembly comprising
a total internal reflection body comprising:
an uppermost portion comprising a optical turning member, wherein the at least one optical fiber is disposed on the uppermost portion,
a lowermost portion opposite the uppermost portion, the lowermost portion comprising a passage;
at least one lens within the passage of the lowermost portion;
a first portion contacting the first surface of the printed circuit board within the recess; and
a second portion;
wherein the first portion and the second portion extend from the lowermost portion on opposite sides of the at least one lens; and
a carrier comprising a first surface and a second surface opposite the first surface; and
at least one active device coupled to the first surface of the carrier, wherein:
the carrier is directly coupled to the lowermost portion of the total internal reflection body such that the first portion and the second portion of the total internal reflection body contact the first surface of the carrier on opposite sides of the at least one active device and maintain a space between the at least one active device and the at least one lens, the carrier covers at least a portion of the passage, and the at least one active device is aligned with the at least one lens such that an optical path is present between the at least one active device and the at least one lens, and
the total internal reflection body is coupled to the printed circuit board at the recess such that the carrier is disposed within the opening of the printed circuit board.

11. The active optical cable assembly of claim 10, further comprising at least one passive device coupled to the second surface of the carrier.

12. The active optical cable assembly of claim 10, wherein:
the printed circuit board comprises one or more fiducial features; and
the total internal reflection body comprises one or more alignment features disposed within the one or more fiducial features to position the total internal reflection sub-assembly relative to the printed circuit board.

13. The active optical cable assembly of claim 10, wherein the at least one lens comprises a plurality of lenses, and the at least one active device comprises a plurality of active devices.

14. The active optical cable assembly of claim 10, wherein the at least one active device comprises at least one of a light source and a light detector.

15. The active optical cable assembly of claim 14, wherein the light source comprises a vertical cavity surface-emitting laser and the light detector comprises a photo diode.

16. The active optical cable assembly of claim 10, wherein the connector comprises a USB connector, a Thunderbolt connector, a HDMI connector, or a PCI Express connector.

17. The active optical cable assembly of claim 10, wherein only the carrier is disposed within the opening of the printed circuit board.

* * * * *